(12) United States Patent
Choi et al.

(10) Patent No.: US 12,226,995 B2
(45) Date of Patent: Feb. 18, 2025

(54) DISPLAY DEVICE AND METHOD FOR MANUFACTURING THE SAME

(71) Applicant: Samsung Display Co., Ltd., Yongin-Si (KR)

(72) Inventors: Wonjoon Choi, Yongin-si (KR); Seul-Gi Kim, Seoul (KR); Yejin Kim, Seoul (KR); Cheolgeun An, Yongin-si (KR); Euiyun Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 863 days.

(21) Appl. No.: 17/099,839

(22) Filed: Nov. 17, 2020

(65) Prior Publication Data

US 2021/0229401 A1  Jul. 29, 2021

(30) Foreign Application Priority Data

Jan. 29, 2020 (KR) .................. 10-2020-0010673

(51) Int. Cl.
  *B32B 7/14*    (2006.01)
  *B32B 3/26*    (2006.01)
  *B32B 37/12*   (2006.01)
  *B32B 37/18*   (2006.01)
  *B32B 38/00*   (2006.01)
  (Continued)

(52) U.S. Cl.
  CPC .............. *B32B 7/14* (2013.01); *B32B 3/266* (2013.01); *B32B 37/1292* (2013.01); *B32B 37/18* (2013.01); *B32B 38/145* (2013.01); *C09J 7/30* (2018.01); *H10K 50/844* (2023.02); *B32B 2255/26* (2013.01); *B32B 2255/28* (2013.01); *B32B 2305/72* (2013.01); *B32B 2307/546* (2013.01); *B32B 2310/0831* (2013.01); *B32B 2457/20* (2013.01); *H10K 77/111* (2023.02); *H10K 2102/311* (2023.02)

(58) Field of Classification Search
  CPC .................................................. C09J 2203/318
  See application file for complete search history.

(56) References Cited

U.S. PATENT DOCUMENTS 10,005,928 B2    6/2018  Kwack et al.
2018/0175323 A1*  6/2018  Ahn ................... H10K 50/8426
2018/0305590 A1* 10/2018  Kwack ................... C09J 133/00

FOREIGN PATENT DOCUMENTS

KR  10-2016-0008307   1/2016
KR  10-2016-0062305   6/2016
KR     10-1966167    4/2019

\* cited by examiner

*Primary Examiner* — Ian A Rummel
(74) *Attorney, Agent, or Firm* — F. CHAU & ASSOCIATES, LLC (57) ABSTRACT

A display device includes: a window including a bending area and a non-bending area; an adhesive layer including a first adhesive portion and a second adhesive portion, wherein the first adhesive portion overlaps the bending area, and the second adhesive portion overlaps the non-bending area; and a display module disposed on the adhesive layer, wherein the first adhesive portion is formed by curing a first resin including a first photoinitiator configured to have an initiation reaction induced by a first light, and the second adhesive portion is formed by curing a second resin including a second photoinitiator configured to have an initiation reaction induced by a second light or a thermal initiator, wherein the second light has a different central wavelength from that of the first light.

12 Claims, 10 Drawing Sheets

(51) Int. Cl.
 *C09J 7/30* (2018.01)
 *H01L 51/52* (2006.01)
 *H10K 50/844* (2023.01)
 *H10K 77/10* (2023.01)
 *H10K 102/00* (2023.01)

DISPLAY DEVICE AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2020-0010673, filed on Jan. 29, 2020, the disclosure of which is hereby incorporated by reference herein in its entirety.

TECHNICAL FIELD

The present inventive concept relates to a bended display device and, more particularly, to a bended display device and a method for manufacturing the same.

DISCUSSION OF THE RELATED ART

Generally, display devices may be used in mobile apparatuses such as a smart phone, a tablet computer, a laptop computer, a digital camera, a camcorder, and a portable information terminal, or in electronic products such as a relatively slim television, a display board for exhibition, and an advertisement board.

In addition, flexible display devices are currently under development, which may be relatively easy to carry and may be applied to apparatuses having various shapes. For example, display devices having a bending area and a non-bending area extending from the bending area are currently under development.

SUMMARY

According to an example embodiment of the present inventive concept, a display device includes: a window including a bending area and a non-bending area; an adhesive layer including a first adhesive portion and a second adhesive portion, wherein the first adhesive portion overlaps the bending area, and the second adhesive portion overlaps the non-bending area; and a display module disposed on the adhesive layer, wherein the first adhesive portion is formed by curing a first resin including a first photoinitiator configured to have an initiation reaction induced by a first light, and the second adhesive portion is formed by curing a second resin including a second photoinitiator configured to have an initiation reaction induced by a second light or a thermal initiator, wherein the second light has a different central wavelength from that of the first light.

In an example embodiment of the present inventive concept, a difference in central wavelengths between the first light and the second light is about 50 nm or more.

In an example embodiment of the present inventive concept, a central wavelength of the first light has a range of about 200 nm to about 300 nm or a range of about 300 nm to about 400 nm, and the central wavelength of the second light has the other range of the range of about 200 nm to about 300 nm and the range of about 300 nm to about 400 nm.

In an example embodiment of the present inventive concept, the first photoinitiator includes at least one of compounds included in a first group or at least one of compounds included in a second group, and the second photoinitiator includes at least one of compounds included in the other group of the first group and the second group, wherein the first group includes 2,2-Dimethoxy-2-phenylacetophenone, (η6-cumene)(η5-cyclopentadienyl) iron hexafluorophosphate, 2-Hydroxy-2-methylpropiophenone, [4-(2-hydroxytetradecyloxy)phenyl]phenyliodonium Hexafluoroantimonate, and 2-Isopropylthioxanthone, and the second group includes 2-Methyl-4'-(methylthio)-2-morpholinopropiophenone, 2-Benzyl-2-(dimethylamino)-4'-morpholinobutyrophenone, and Diphenyl (2,4,6-trimethylbenzoyl)-phosphine oxide.

In an example embodiment of the present inventive concept, a hole is passes through the display module and the adhesive layer and overlaps the non-bending area.

In an example embodiment of the present inventive concept, the adhesive layer further includes a third adhesive portion disposed between the first adhesive portion and the second adhesive portion and overlapping the non-bending area, wherein the third adhesive portion is formed by curing third resin including the first photoinitiator and the second photoinitiator.

In an example embodiment of the present inventive concept, the first photoinitiator and the second photoinitiator have concentration gradients in the third resin.

In an example embodiment of the present inventive concept, the first adhesive portion does not include the second photoinitiator, and the second adhesive portion does not include the first photoinitiator.

In an example embodiment of the present inventive concept, the display module includes: a base substrate; a light emitting element layer disposed on the base substrate; and a thin film encapsulation layer disposed on the light emitting element layer and sealing the light emitting element layer.

In an example embodiment of the present inventive concept, the bending area includes a first bending area and a second bending area, and the non-bending area is provided between the first bending area and the second bending area.

According to an example embodiment of the present inventive concept, a display device includes: a window including a first window portion and a second window portion, wherein the first window portion has a bent shape, and the second window portion has a flat shape; a display module including a first portion and a second portion, wherein the first portion overlaps the first window portion, and the second portion overlaps the second window portion, wherein a hole passes through the second portion; and an adhesive layer including a first adhesive portion and a second adhesive portion, wherein the first adhesive portion is disposed between the first window portion and the first portion, and the second adhesive portion is disposed between the second window portion and the second portion, wherein the first adhesive portion is formed by curing a first resin including a first photoinitiator configured to have an initiation reaction induced by a first light, and the second adhesive portion is formed by curing a second resin including a second photoinitiator configured to have an initiation reaction induced by a second light having a different central wavelength from the first light.

In an example embodiment of the present inventive concept, reactivity of the second photoinitiator with respect to the first light is lower than reactivity of the first photoinitiator with respect to the first light.

According to an example embodiment of the present inventive concept, a method for manufacturing a display device, the method including: providing a display module including a first area and a second area; applying first resin on the first area of the display module, wherein the first resin includes a first initiator; applying second resin on the second area of the display module, wherein the second resin includes a second initiator different from the first initiator; forming a first preliminary adhesive layer by curing the first resin to have a cure rate of about 50% to about 80%; aligning a window with the display module, wherein the window includes a bending area and a non-bending area; and combining the display module and the window to each other.

In an example embodiment of the present inventive concept, the method further includes forming a second preliminary adhesive layer by curing the second resin to have a cure rate of about 10% to about 40%.

In an example embodiment of the present inventive concept, the display module further includes a hole in the second area, and the second resin is applied so as not to overlap the hole.

In an example embodiment of the present inventive concept, the forming of the first preliminary adhesive layer includes irradiating light to the first resin and the second resin, wherein, in the irradiating of the light, the first resin is cured to have a cure rate of about 50% to about 80%, and the second resin is cured to have a cure rate of about 40% or less.

In an example embodiment of the present inventive concept, the first initiator includes at least one of compounds included in a first group or at least one of compounds included in a second group, and the second initiator includes at least one of compounds included in the other group of the first group and the second, wherein the first group includes 2,2-Dimethoxy-2-phenylacetophenone, (η6-cumene)(η5-cyclopentadienyl)iron hexafluorophosphate, 2-Hydroxy-2-methylpropiophenone, [4-(2-hydroxytetradecyloxy)phenyl] phenyliodonium Hexafluoroantimonate, and 2-Isopropylthioxanthone, and the second group includes 2-Methyl-4'-(methylthio)-2-morpholinopropiophenone, 2-Benzyl-2-(dimethylamino)-4'-morpholinobutyrophenone, and Diphenyl (2,4,6-trimethylbenzoyl)-phosphine oxide.

In an example embodiment of the present inventive concept, the method further includes, after the combining of the display module and the window, curing the first preliminary adhesive layer and the second resin to have a cure rate of about 90% to about 100%.

In an example embodiment of the present inventive concept, the aligning of the window with the display module includes: aligning the bending area of the window with the first area of the display module, and aligning the non-bending area of the window with the second area of the display module.

In an example embodiment of the present inventive concept, the first resin and the second resin are applied by an inkjet printing method.

BRIEF DESCRIPTION OF THE FIGURES

The above and other features of the present inventive concept will become more apparent by describing in detail example embodiments thereof, with reference to the accompanying drawings, in which.

DETAILED DESCRIPTION OF THE EMBODIMENTS

In this specification, when an element (or, e.g., a region, a layer, a portion, or the like) is referred to as "being on", "being connected to", or "being coupled to" another element, it may be directly disposed/connected/coupled to another element, or an intervening third element may also be disposed therebetween.

Like numbers may refer to like elements throughout the specification, and thus their description will be omitted. The thickness, the ratio, and the dimension of an element may be exaggerated for clarity.

It is to be understood that "and/or" includes any and all combinations of one or more of the associated listed items.

It will be understood that, although the terms "first", "second", etc. may be used herein to describe various elements, these elements should not be limited by these terms. These terms are only used to distinguish one element from another element. For example, a first element may be referred to as a second element, and similarly, a second element may be referred to as a first element without departing from the teachings of the present inventive concept. As used herein, the singular forms of terms are intended to include the plural forms as well, unless the context clearly indicates otherwise.

In addition, spatially relative terms, such as "below", "lower", "above", "upper" and the like, may be used to describe the relationships between the components illustrated in the drawings. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

In the specification, "being disposed directly on" means that a separate adhesive layer is not between a first component disposed directly on a second component.

Hereinafter, example embodiments of the present inventive concept will be described with reference to the accompanying drawings.

Figure 1:
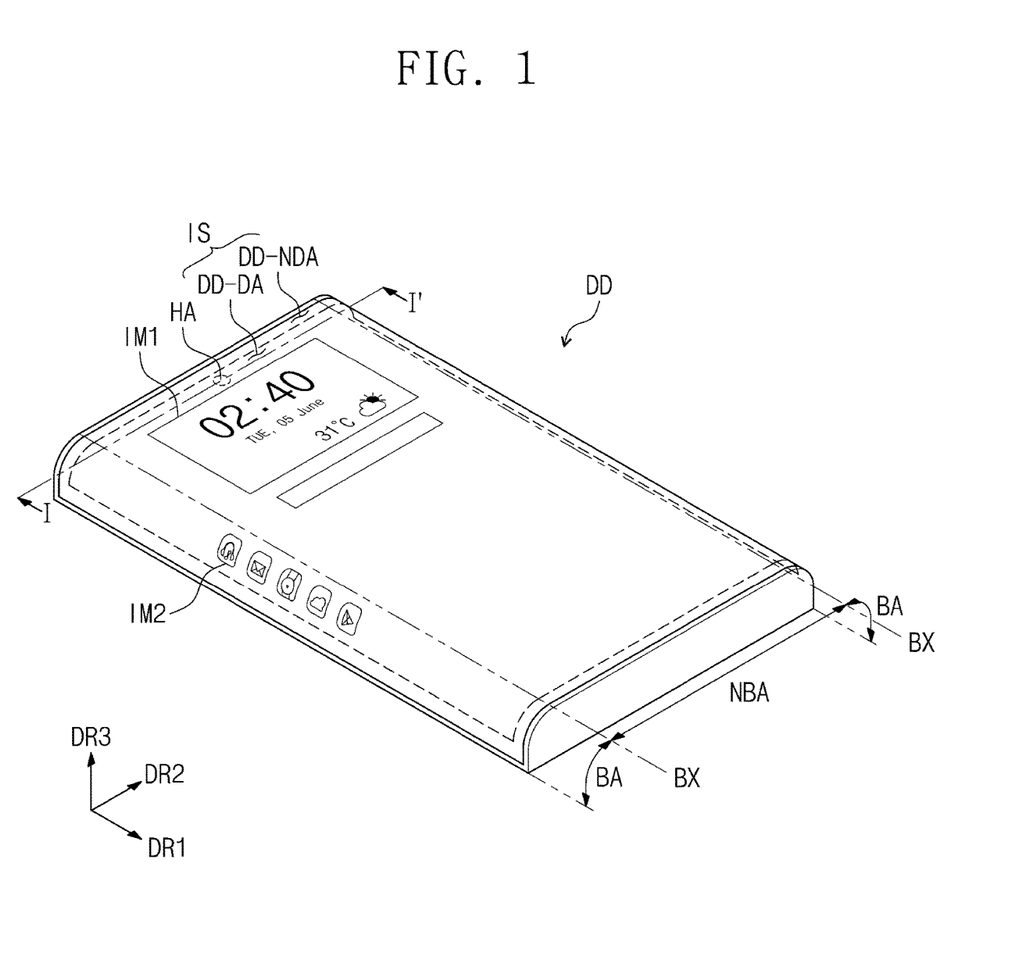
FIG. 1 is a perspective view of a display device according to an example embodiment of the present inventive concept.
Figure 2:
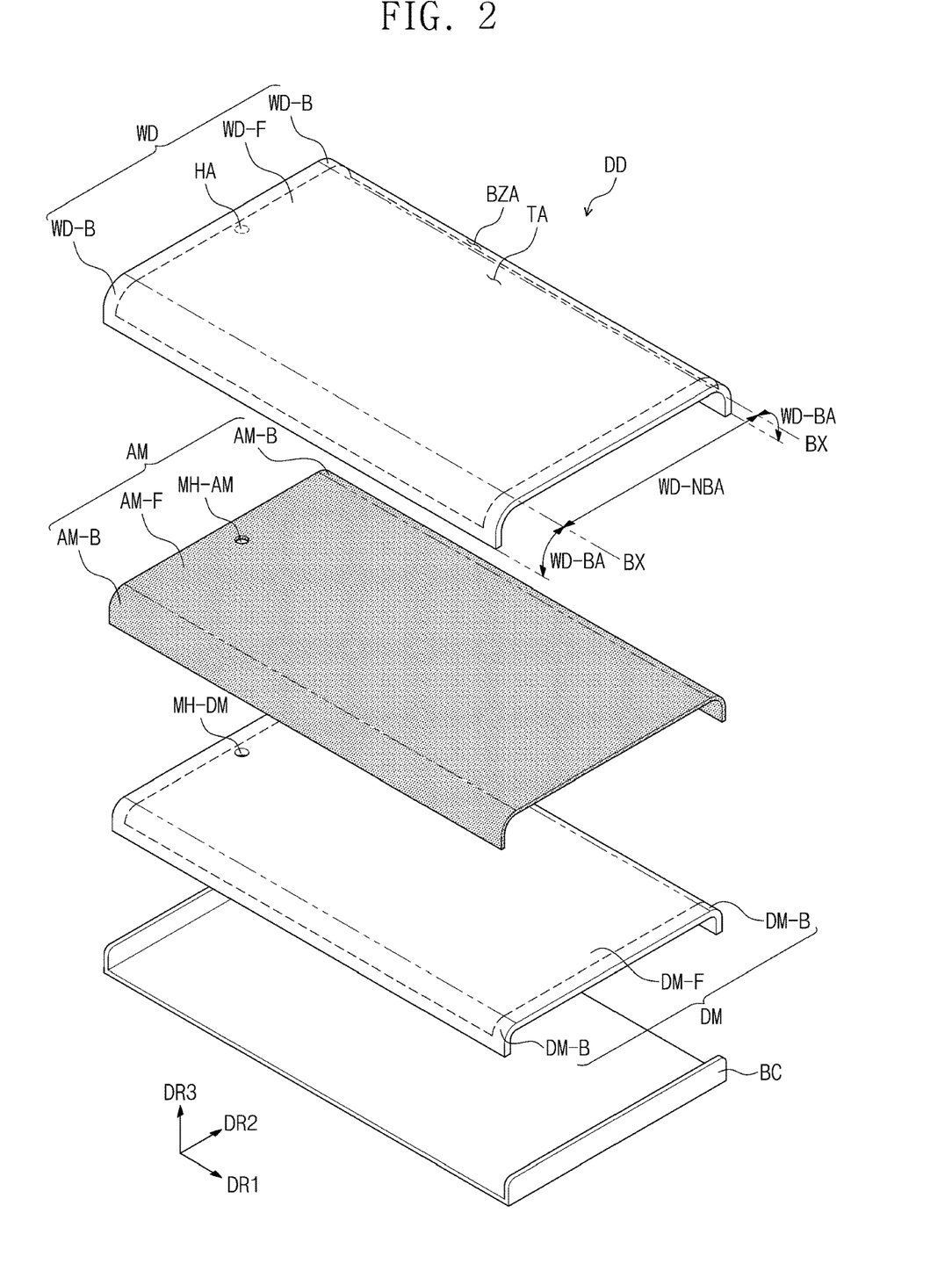
FIG. 2 is an exploded perspective view of a display device according to an example embodiment of the present inventive concept.
Figure 3A:
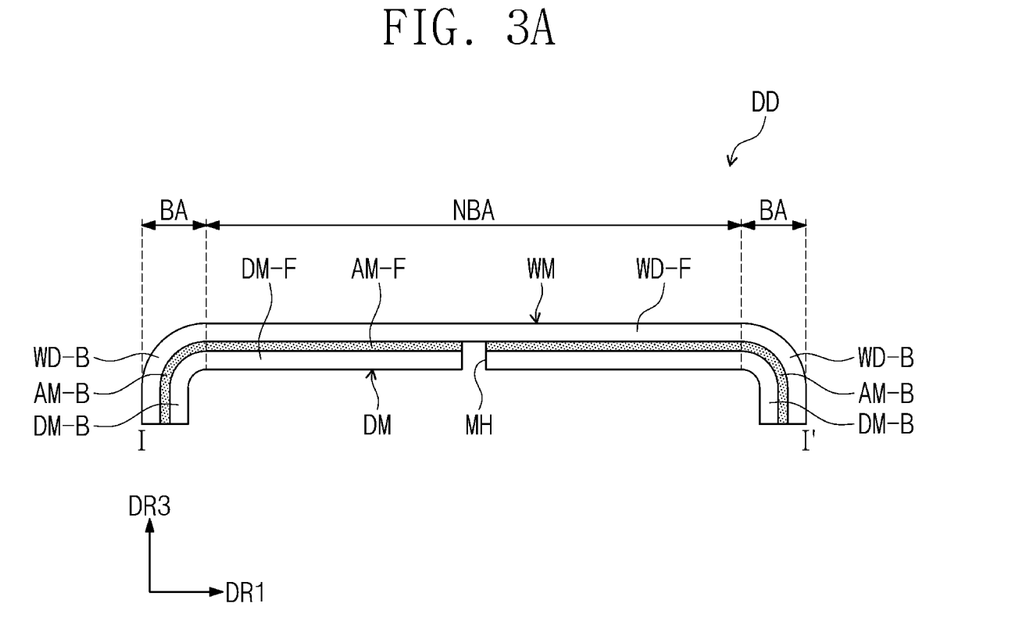
FIG. 3A is a cross-sectional view of the display device, taken along line I-I' of FIG. 1.
Figure 3B:
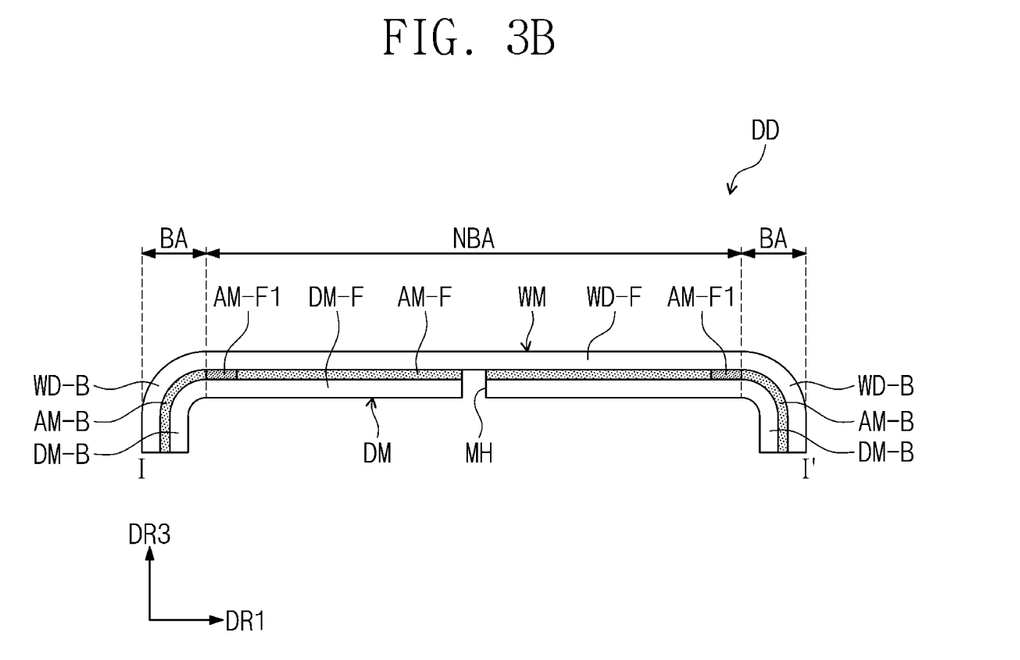
FIG. 3B is a cross-sectional view of a display device according to an example embodiment of the present inventive concept.

FIG. 1 is a perspective view of a display device DD according to an example embodiment of the present inventive concept. FIG. 2 is an exploded perspective view of the display device DD according to an example embodiment of the present inventive concept. FIG. 3A is a cross-sectional view of the display device, taken along line I-I' of FIG. 1. FIG. 3B is a cross-sectional view of a display device DD according to an example embodiment of the present inventive concept. FIG. 3B illustrates the cross-sectional view corresponding to that of FIG. 3A.

In FIGS. 1 and 2, a mobile terminal including two edges that are curved is illustrated as an example. However, the present inventive concept is not limited thereto. For example, a first edge of the mobile terminal may be curved, or a plurality of edges of the mobile terminal may be curved. Although not separately illustrated, the display device DD according to an example embodiment of the present inventive concept may be used in relatively large scale electronic devices such as a television and an outdoor advertising board and also in relatively small-to-medium scale electronic devices such as a personal computer, a laptop computer, a personal digital terminal, a vehicle navigation unit, a game console, a mobile electronic device, a wrist watch type electronic device, and a camera. These are merely provided as examples, and thus the display device DD may be employed in other electronic devices without departing from the spirit and scope of the present inventive concept.

In the display device DD according to an example embodiment of the present inventive concept, a plurality of areas distinguished on a display surface IS are provided. In the display device DD, a display area DD-DA, a non-display area DD-NDA, and a hole area HA may be provided. The display area DD-DA displays images IM1 and IM2, and the non-display area DD-NDA is adjacent to the display area DD-DA. In an example embodiment of the present inventive concept, the non-display area DD-NDA may be omitted. In FIG. 1, the images IM1 and IM2 are illustratively shown as a clock widget or the like. For example, the non-display area DD-NDA may surround the display area DD-DA. An edge of the hole area HA may be surrounded by the display area DD-DA. In a plan view, the hole area HA may be spaced apart from the non-display area DD-NDA with the display area DD-DA disposed therebetween. The hole area HA is an area in which a hole MH is provided. Accordingly, in the plan view, a module hole MH may be surrounded by the display area DD-DA on which the images IM1 and IM2 are displayed.

The display device DD according to an example embodiment of the present inventive concept may include a bending area BA and the non-bending area NBA. The bending area BA may be an area which is bent with respect to a bending axis BX. The non-bending area NBA may be an area which extends from the bending area BA and is flat. The bending area BA may an edge area of the display device DD. The bending area BA may be provided on each of one side surface and the other side surface of the display device DD. Here, the bending area BA provided on one side surface of the display device DD may be referred to as a first bending area, and the bending area BA provided on the other side surface of the display device DD may be referred to as a second bending area.

The non-bending area NBA may be parallel to a plane provided by a first direction DR1 and a second direction DR2. A normal direction of the display device DD is indicated as a third direction DR3. In this specification, "in a plan view or when viewed in a plan view" may mean that a configuration is viewed in the third direction DR3. It is to be understood that a front surface (or a top surface) and a rear surface (or a bottom surface) of each of layers or units described below are distinguished by the third direction DR3. However, directions indicated as the first to third directions DR1, DR2, and DR3 have relative concepts and thus may be changed to other directions, for example, opposite directions. Hereinafter, the first to third directions refer to the same reference symbols as the directions indicated by the first and third directions DR1, DR2, and DR3, respectively.

FIGS. 1 and 2 illustratively show that two bending areas BA are provided in edges of the display device, and the non-bending area NBA is provided between the two bending areas BA. However, the present inventive concept is not limited thereto. For example, one bending area BA and one non-bending area NBA may be formed in the display device DD.

For example, the bending area BA may be an area corresponding to the side surface of the display device DD, and the non-bending area NBA may be an area corresponding to the front surface of the display device DD.

Referring to FIGS. 2, 3A, and 3B, a window WD may be disposed on the front surface of a display module DM and may protect the display module DM from, for example, an impact. For example, the window WD may have a glass substrate, a sapphire substrate, or a plastic film. The window WD may be a flexible window.

The window WD may be divided into a transmission area TA and a bezel area BZA. The transmission area TA may be an area that allows light being incident to the transmission area TA to pass therethrough. The transmission area TA may be an area corresponding to the display area DD-DA. For example, the transmission area TA may overlap the entire surface of the display area DD-DA or at least a portion thereof. The image IM1 and IM2 displayed on the display area DD-DA of the display module DM may be viewed through the transmission area TA.

The bezel area BZA may have a relatively lower light transmittance than the transmission area TA. For example, the bezel area BZA may have no light transmittance. The bezel area BZA may be an area corresponding to the non-display area DD-NDA. The bezel area BZA defines a shape of the transmission area TA. The bezel area BZA may be adjacent to the transmission area TA, and may at least partially surround the transmission area TA.

The bezel area BZA may have a predetermined color. The bezel area BZA covers the non-display area DD-NDA of the display module DM, and thus may prevent the non-display area NDA from being viewed from the outside. However, this is merely illustrated as an example and the present inventive concept is not limited thereto. For example, the bezel area BZA may be omitted in the window WD according to an example embodiment of the present inventive concept.

In the window WD, a bending area WD-BA and a non-bending area WD-NBA may be provided, which may be substantially the same areas as the bending area BA and the non-bending area NBA, respectively, described above.

The window WD may include a first window portion WD-B and a second window portion WD-F. The first window portion WD-B may be a portion corresponding to the bending area BA. The second window portion WD-F may be a portion corresponding to the non-bending area NBA. The first window portion WD-B may have a bent shape. The second window portion WD-F may extend from the first window portion WD-B and have a flat shape. For example, the second window portion WD-F may be provided between two first window portions WD-B.

On the window WD, an adhesive layer AM may be disposed. For example, the adhesive layer AM may be disposed directly on the window WD. The adhesive layer AM may include a first adhesive portion AM-B and a second adhesive portion AM-F. The first adhesive portion AM-B may be a portion corresponding to the bending area BA, and the second adhesive portion AM-F may be a portion corresponding to the non-bending area NBA. The adhesive layer AM may allow the window WD and the display module DM to be adhered to each other. The first adhesive portion AM-B is disposed between the first window portion WD-B and a first portion DM-B of the display module DM described later, and the second adhesive portion AM-F is disposed between the second window portion WD-F and a second portion DM-F of the display module DM described later. Therefore, the window WD and the display module DM may be adhered to each other.

The first adhesive portion AM-B may be formed by curing first resin RS1 which will be described later and includes a first photoinitiator in which an initiation reaction is induced by first light. The second adhesive portion AM-F may be formed by curing second resin RS2 which will be described later and includes a second photoinitiator, in which an initiation reaction is induced by second light, or a thermal initiator. Thus, the first adhesive portion AM-B and the second adhesive portion AM-F may have different compositions. The first adhesive portion AM-B may include a product of a curing reaction between the first photoinitiator and base resin. The second adhesive portion AM-F may include a product of a curing reaction between the second photoinitiator and base resin or a product of a curing reaction between the thermal initiator and the base resin. First light L1 and second light L2 may have different central wavelengths from each other. The first light L1, the second light L2, the first photoinitiator, and the second photoinitiator will be described in detail later.

Referring to FIG. 3B, an adhesive layer AM of an example embodiment of the present inventive concept may further include a third adhesive portion AM-F1. The third adhesive portion AM-F1 may be disposed between the first adhesive portion AM-B and the second adhesive portion AM-F, and may overlap the non-bending area NBA. The third adhesive portion AM-F1 may be formed by curing a third resin RS3 which includes the first photoinitiator and the second photoinitiator. Accordingly, the third adhesive portion AM-F1 may include the first photoinitiator, the second photoinitiator, and products of a curing reaction with the base resin.

The display module DM may include a first portion DM-B and a second portion DM-F. The first portion DM-B may be a portion corresponding to the bending area BA, and the second portion DM-F may be a portion corresponding to the non-bending area NBA. The first portion DM-B may overlap the first window portion WD-B, and the second portion DM-F may overlap the second window portion WD-F.

Referring to FIGS. 2, 3A, and 3B, the hole MH may pass through the display module DM and the adhesive layer AM. The hole MH may overlap the hole area HA (See, e.g., FIG. 1). The hole MH may include an adhesive layer hole MH-AM and a display module hole MH-DM. The adhesive layer hole MH-AM may be formed in the adhesive layer AM, and the display module hole MH-DM may be formed in the display module DM. The hole MH may accommodate an electronic module. For example, the hole MH may accommodate electronic modules such as a camera module, an infrared sensing module, and the like.

Referring to FIGS. 1 and 2, the display device DD may further include an accommodation member BC. The accommodation member BC may be coupled to the window WD. The accommodation member BC provides the rear surface of the display device DD. The accommodation member BC may be coupled to the window WD to form an inner space therebetween.

The accommodation member BC may stably protect components of the display device DD, which are accommodated in the inner space, against external impacts. The display module DM, the electronic module, or the like may be accommodated in the inner space provided by the accommodation member BC.

Figure 4:
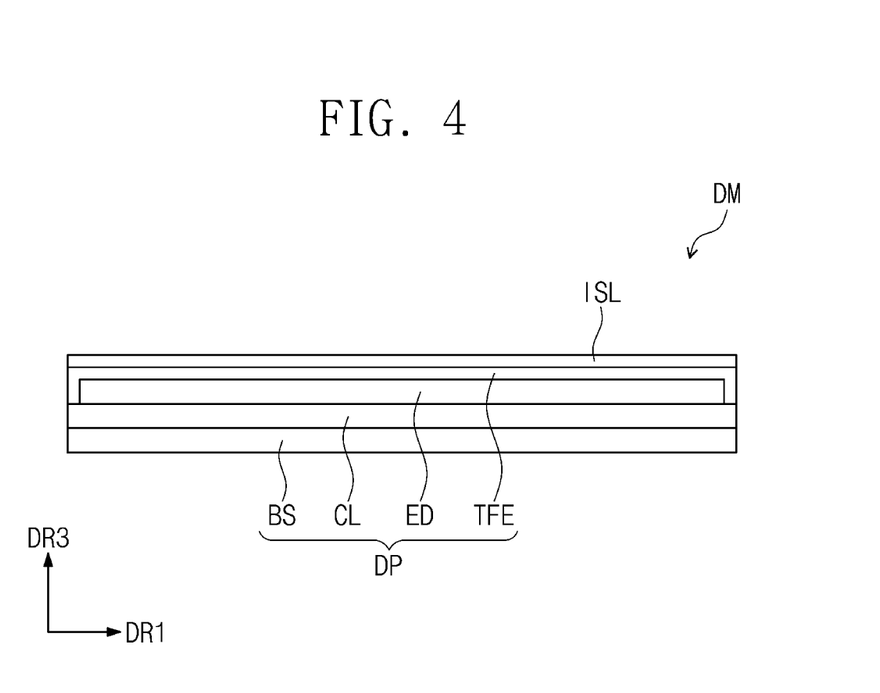
FIG. 4 is a cross-sectional view of a display module according to an example embodiment of the present inventive concept.

FIG. 4 is a cross-sectional view of a display module DM. Referring to FIG. 4, the display module DM of an example embodiment of the present inventive concept may include a base layer BS, a circuit layer CL, a light emitting element layer ED, and a thin film encapsulation layer TFE.

For example, the base layer (e.g., a base substrate) BS may be an insulating substrate. The base layer BS may be flexible. For example, the base layer BS may be a flexible substrate including polyimide (PI). However, the present inventive concept is not limited thereto. The base layer BS may be made of various materials such as glass and plastic. A plastic substrate may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and/or a perylene-based resin.

The circuit layer CL may be disposed on the base layer BS. The circuit layer CL may include transistors and a plurality of insulating layers for insulating the transistors. Each of the plurality of insulating layers may include, for example, an organic material and/or an inorganic material, and may have a single- or multi-layered structure.

The light emitting element layer ED may be disposed on the circuit layer CL. The light emitting element layer ED may include an organic electroluminescence element. The organic electroluminescence element may include a cathode, an anode, and a light emitting layer disposed between the cathode and the anode. The organic electroluminescence element may further include a hole transport layer and an electron transport layer. The hole transport layer may be disposed between the anode and the light emitting layer, and the electron transport layer may be disposed between the cathode and the light emitting layer. The organic electroluminescence element may further include a capping layer disposed on the cathode. The light emitting layer may include an organic light emitting material, but the present inventive concept is not limited thereto. For example, the light emitting element may be a quantum dot light emitting element in which the light emitting layer has quantum dots.

The thin film encapsulation layer TFE may be disposed on the light emitting element layer ED to cover the light emitting element layer ED. The thin film encapsulation layer TFE may include at least one inorganic layer and at least one organic layer. For example, the thin film encapsulation layer TFE may have a lamination structure including an inorganic layer, an organic layer, and an inorganic layer. The thin film encapsulation layer TFE may prevent moisture or air from permeating the light emitting element.

An input sensing layer ISL may be disposed on the thin film encapsulation layer TFE. The input sensing layer ISL may be formed on the thin film encapsulation layer TFE through a continuous process. For example, the input sensing layer ISL may be disposed directly on the thin film encapsulation layer TFE. The input sensing layer ISL may sense an external input, such as a touch from a user's body part or an object (e.g., a stylus). The input sensing layer ISL may be an electrostatic capacitance-type input sensing layer ISL capable of sensing an external input by detecting a change in electrostatic capacitance due to an external object. In addition, the input sensing layer ISL may be a pressure sensitive-type input sensing layer ISL sensing an external input by detecting a change in pressure due to an external object.

Hereinafter, a method for manufacturing a display device DD according to an example embodiment of the present inventive concept will be described in detail with reference to FIGS. 5 to 14. Hereinafter, detailed descriptions of components that may be assumed to be at least similar to the components described with reference to FIGS. 1 to 4 may be omitted.

Figure 5:
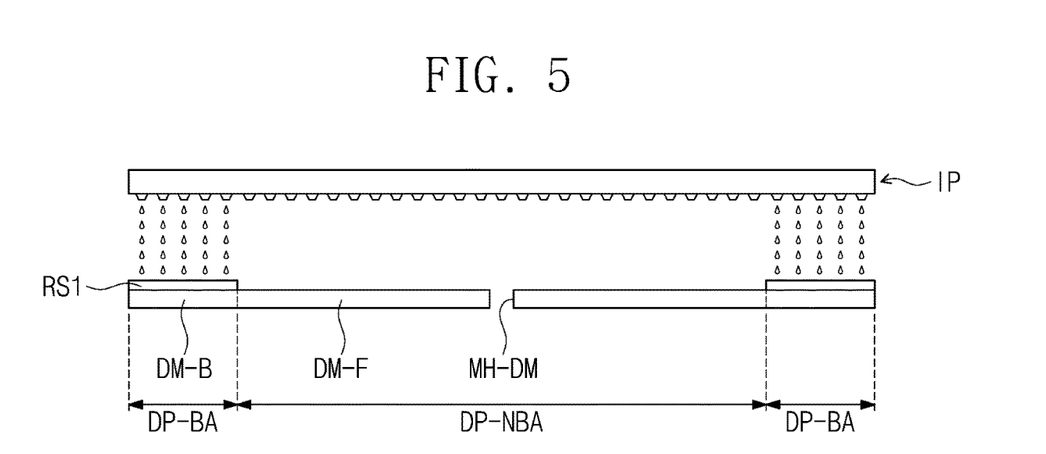
FIGS. 5 and 6 are cross-sectional views showing a method for manufacturing a display device according to an example embodiment of the present inventive concept.
Figure 6:
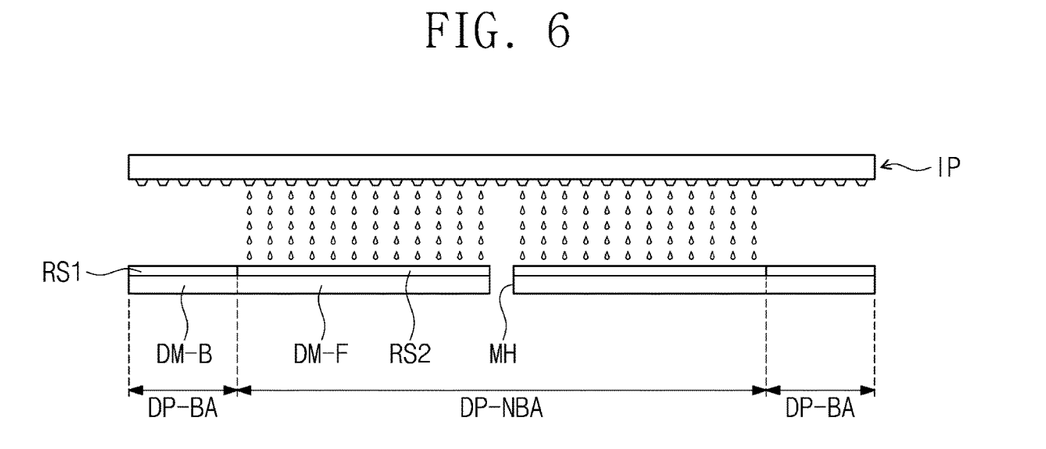

FIGS. 5 and 6 schematically illustrate application of a first resin RS1 and a second resin RS2 in the method for manufacturing a display device DD according to an example embodiment of the present inventive concept. The method for manufacturing the display device DD according to an example embodiment of the present inventive concept include providing a display module DM, applying the first resin RS1 on the display module DM, and applying the second resin RS2 on the display module DM.

A first area DP-BA and a second area DP-NBA may be provided in the display module DM. The first area DP-BA may be combined with the window WD and may be bent, and the second area DP-NBA may be combined with the window WD and is flat (e.g., not bent). For example, the first portion DP-BA may be a portion corresponding to the bending area BA described above, and the second portion DB-NBA may be a portion corresponding to the non-bending area NBA described above. The first resin RS1 may be applied on the first area DP-BA of the display module DM, and the second resin RS2 may be applied on the second area DP-NBA of the display module DM. Accordingly, the first resin RS1 may be applied to overlap the first area DP-BA of the display module DM in a plan view, and the second resin RS2 may be applied to overlap the second area DP-NBA of the display module DM in the plan view. The second resin RS2 may be applied to not overlap a display module hole MH-DM in the plan view.

A method for applying the first resin RS1 and the second resin RS2 is not particularly limited, and as illustrated in FIGS. 5 and 6, the resin may be applied by, for example, an inkjet printing device IP. When the first resin RS1 and the second resin RS2 are applied by an inkjet printing method, a separate mask may not be used, and an amount of resin to be used may be reduced. Thus, process time and costs may be reduced.

The first resin RS1 and the second resin RS2 may have different compositions from each other. The first resin RS1 may include a first initiator, and the second resin RS2 may include a second initiator. The first initiator and the second initiator may be different initiators from each other. The first resin RS1 may not include the second initiator, and the second resin RS2 may not include the first initiator. The first initiator may be a first photoinitiator that reacts to a first light L1. The second initiator may be a second photoinitiator that reacts to a second light L2 different from the first light L1 or may be a thermal initiator reacted by heat. The reactivity of the second photoinitiator with respect to the first light L1 may be lower than the reactivity of the first photoinitiator with respect to the first light L1. The first light L1 may have a high reactivity with the first photoinitiator and may have a low reactivity with the second photoinitiator. The second light L2 may have a high reactivity with the second photoinitiator and may have a low reactivity with the first photoinitiator.

A difference in central wavelengths between the first light L1 and the second light L2 may be about 50 nm or more. For example, the difference in central wavelengths between the first light L1 and the second light L2 may be about 50 nm to about 200 nm. When the difference in central wavelengths between the first light L1 and the second light L2 is about 50 nm or less, while the first resin RS1 is cured by the first light L1, the second resin RS2 may also be cured relatively rapidly.

A central wavelength of the first light L1 may have one range selected from a range of about 200 nm to about 300 nm or a range of about 300 nm to about 400 nm, and a central wavelength of the second light L2 may have the other range. For example, the range of the central wavelength of the first light L1 may be about 200 nm to about 300 nm, and the range of the central wavelength of the second light L2 may be about 300 nm to about 400 nm.

The first photoinitiator may include at least one of compounds included in a following first group or at least one of compounds included in a following second group, and the second photoinitiator may include at least one of compounds included in the other group of the following first group and following second group. For example, the first photoinitiator may include at least one of the compounds included in the following first group, and the second photoinitiator may include at least one of the compounds included in the second group.

[First Group]:
2,2-Dimethoxy-2-phenylacetophenone, (η6-cumene)(η5-cyclopentadienyl)iron hexafluorophosphate, 2-Hydroxy-2-methylpropiophenone, [4-(2-hydroxytetradecyloxy)phenyl]phenyliodonium Hexafluoroantimonate, and 2-Isopropylthioxanthone

Figure 7:
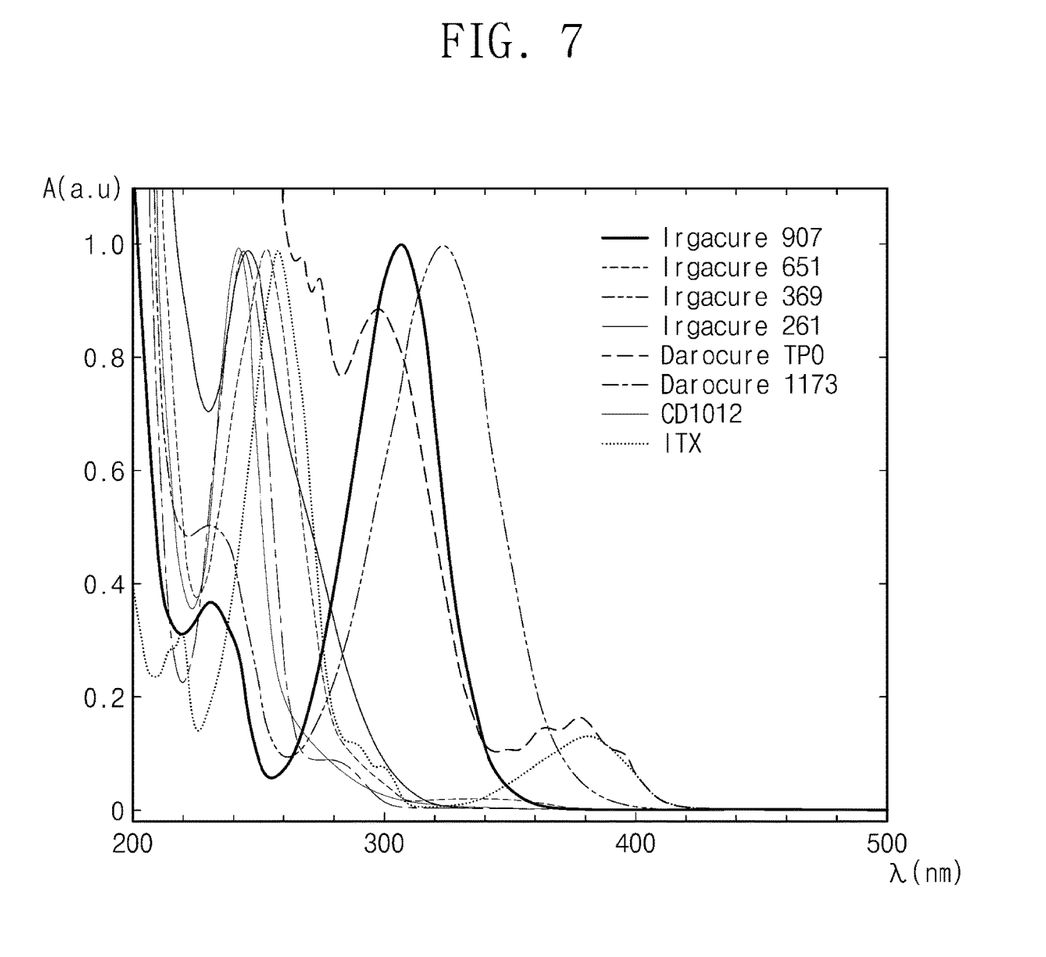
FIG. 7 is a cross-sectional view showing absorbance of photoinitiators according to an example embodiment of the present inventive concept.

[Second Group]:
2-Methyl-4'-(methylthio)-2-morpholinopropiophenone, 2-Benzyl-2-(dimethylamino)-4'-morpholinobutyrophenone, and Diphenyl (2,4,6-trimethylbenzoyl)-phosphine oxide FIG. 7 is a graph illustrating absorbance of a photoinitiator including at least one of the compounds of the first group or the second group. Referring to FIG. 7, a photoinitiator including at least one of the compounds of the first group, such as IRGACURE 651 (2,2-Dimethoxy-2-phenylacetophenone), IRGACURE 261 ((η6-cumene)(η5-cyclopentadienyl) iron hexafluorophosphate), DAROCURE 1173 (2-Hydroxy-2-methylpropiophenone), CD1012 ([4-(2-hydroxytetradecyloxy)phenyl]phenyliodonium Hexafluoroantimonate), or ITX (2-Isopropylthioxanthone), may have a high absorbance (A) in a wavelength range of about 200 nm to about 300 nm. In addition, a photoinitiator including at least one of the compounds of the second group, such as DAROCURE TPO (2-Methyl-4'-(methylthio)-2-morpholinopropiophenone), IRGACURE 907 (2-Benzyl-2-(dimethylamino)-4'-morpholinobutyrophenone), or IRGACURE 369 (Diphenyl (2,4,6-trimethylbenzoyl)-phosphine oxide), may have a high absorbance (A) in a wavelength range of about 300 nm to about 400 nm.

In an example embodiment of the present inventive concept, the first resin RS1 and the second resin RS2 may include curable monomers or a photocurable base resin such as photocurable oligomers. In a case in which the second resin RS2 includes a thermal curing agent, the second resin RS2 may include a thermosetting base resin such as a thermosetting monomer and a thermosetting oligomer. For example, the first resin RS1 and the second resin RS2 may include base resin such as an acrylic monomer or an acrylic oligomer. The first resin RS1 and the second resin RS2 may further include a cross-linking agent.

FIGS. 8 to 14 schematically illustrates forming an adhesive layer AM and combining a display module DM and a window WD, in the method for manufacturing the display device DD according to an example embodiment of the present inventive concept.

Figure 8A:
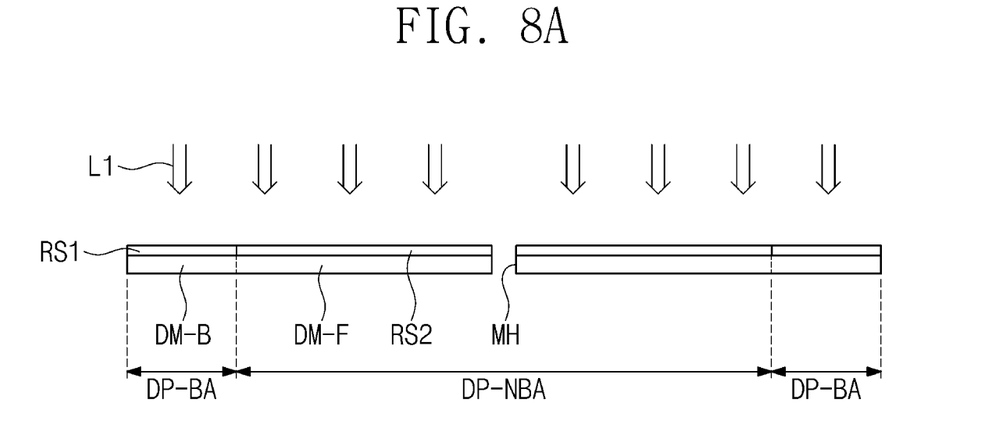
FIGS. 8A, 8B, 9, 10, 11, 12, 13, and 14 are cross-sectional views showing a method for manufacturing a display device according to an example embodiment of the present inventive concept.
Figure 9:
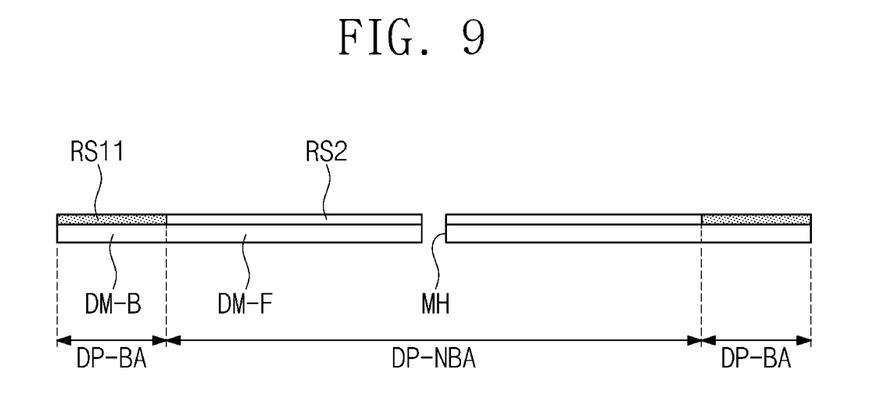

Referring to FIGS. 8A, 8B, and 9, the method for manufacturing the display device DD according to an example embodiment of the present inventive concept includes forming a first preliminary adhesive layer RS11 by curing first resin RS1. Referring to FIG. 8A, the first light L1 is irradiated on the surfaces of the applied first resin RS1 and second resin RS2. For example, the first light L1 may be irradiated on the entire surface of the first resin RS1 and the second resin RS2. Referring to FIG. 9, the first resin RS1 including the first photoinitiator may be cured by the first light L1. The first resin RS1 may be cured by the first light L1 to have a cure rate of about 50% to about 80%, and thus, the first preliminary adhesive layer RS11 may be formed. Referring to FIG. 9, the second resin RS2 including the second photoinitiator or the thermal initiator may be cured by the first light L1 to have a cure rate of about 40% or less, or may not be cured thereby. Thus, since the curing reaction of the first resin RS1 may be selectively performed without a separate mask, process costs and process time may be reduced.

Figure 8B:
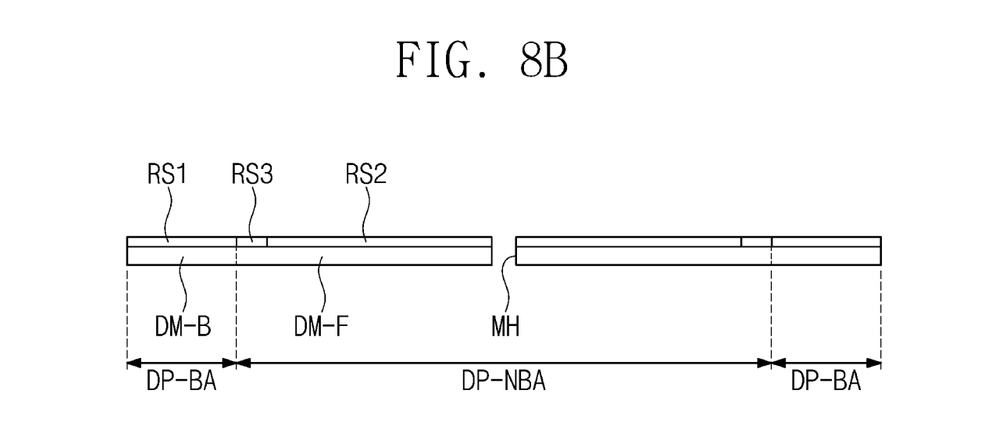

Referring to FIG. 8B, a third resin RS3 may be formed between the first resin RS1 and the second resin RS2. The third resin RS3 may be formed as the first resin RS1 and the second resin RS2 are diffused toward each other. Accordingly, the third resin RS3 may include both the first initiator and the second initiator. The first initiator and the second initiator may have concentration gradients in the third resin RS3. The concentration of the first initiator may increase toward the first resin and may decrease toward the second resin. The concentration of the second initiator may increase toward the second resin and may decrease toward the first resin. Accordingly, when the first light L1 is irradiated on the first resin RS1 and the second resin RS2, the third resin RS3 may be cured so that a cure degree thereof becomes higher toward the first resin RS1 and becomes lower toward the second resin RS2. In this case, the cure degree increases gradually between the first preliminary adhesive layer RS11 and a second preliminary adhesive layer RS21, which may have been formed, for example, by being cured by the first light L1. Thus, a boundary between the first preliminary adhesive layer RS11 and the second preliminary adhesive layer RS21 may be prevented from being damaged due to a difference in cure degree. In addition, since the first initiator and the second initiator are contained in the third resin RS3 to have concentration gradients, a stain due to a difference in components may be prevented from being viewed. Depending on a process, the third resin RS3 may not be formed.

Hereinafter, with respect to a case in which the third resin RS3 is not formed, the method for manufacturing the display device DD will be described.

Figure 10:
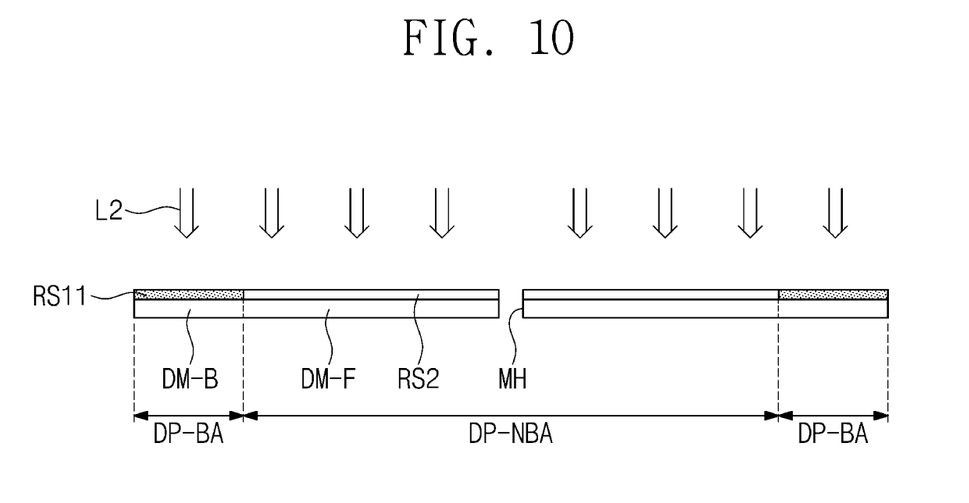
Figure 11:
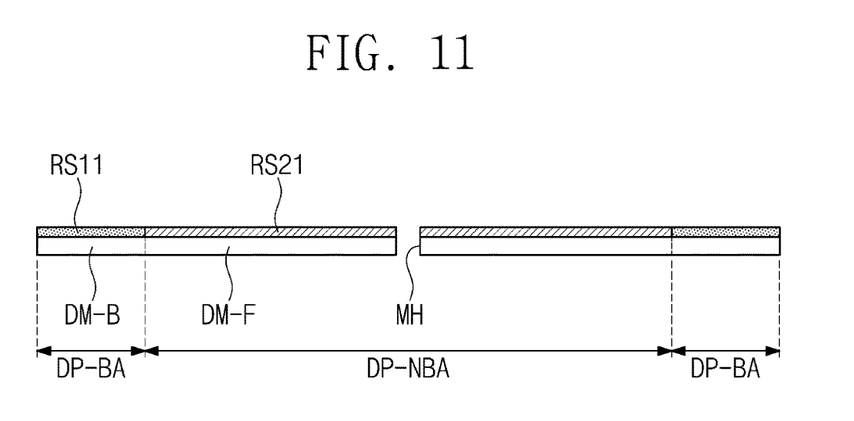

Referring to FIGS. 10 and 11, the method for manufacturing the display device DD according to an example embodiment of the present inventive concept may further include forming a second preliminary adhesive layer RS21 by curing the second resin RS2.

Referring to FIG. 10, the second light L2 is irradiated on the surfaces of the first preliminary adhesive layer RS11 and the second resin RS2. For example, the second light L2 may be irradiated on the entire surfaces of the first preliminary adhesive layer RS11 and the second resin RS2. Referring to FIG. 11, the second resin RS2 including the second photoinitiator may be cured by the second light L2. The second resin RS2 may be cured by the second light 12 to have a cure rate of about 10% to about 40%, and thus the second preliminary adhesive layer RS21 may be formed. In a case in which the second resin RS2 includes a thermal initiator, a predetermined heat may be applied instead of the second light L2. Referring to FIG. 10, the first resin RS1 including the first photoinitiator may not be cured by the second light L2.

The second resin RS2 may be slowly cured by the first light L1. For example, while the first resin RS1 is cored by the first light L1 to have a cure rate of about 50% to about 80%, the second resin RS2 may be cured to have a cure rate of about 10% to about 40%, and thus the second preliminary adhesive layer RS21 may be formed. In addition, although the second photoinitiator has not reacted with the first light L1, the second resin RS2 is cured, through natural curing, to have a cure rate of about 10% to about 40%, which may form the second preliminary adhesive layer RS21. In this case, irradiating of the second light L2 may be omitted.

In an example embodiment of the present inventive concept, forming of the second preliminary adhesive layer RS12 may be omitted. For example, the second resin RS2 may be adhered directly to the window WD.

Figure 12:
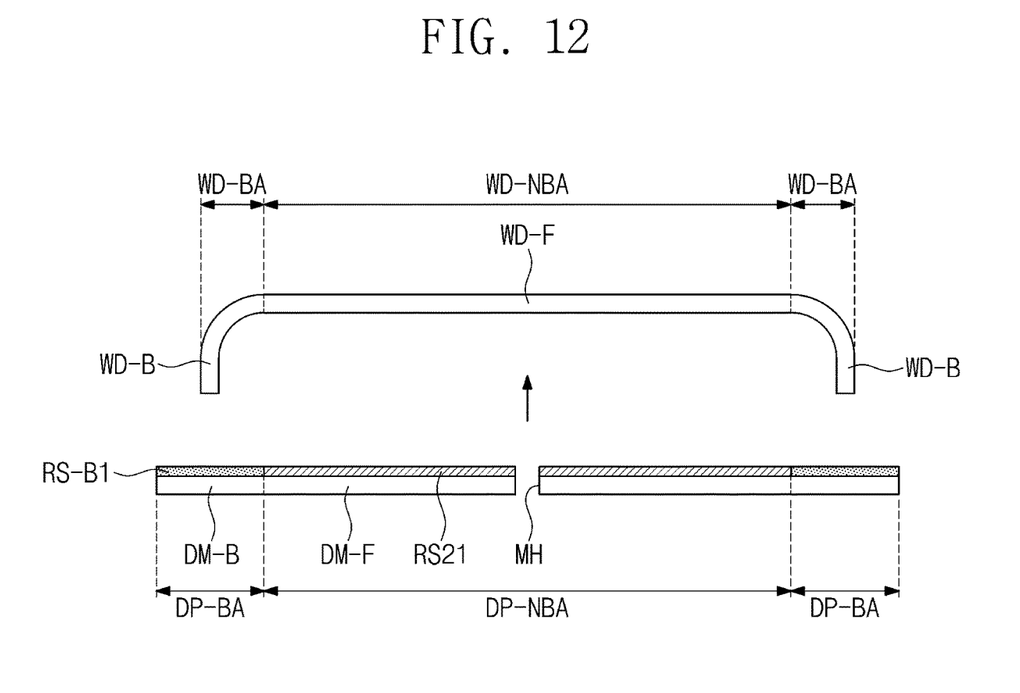
Figure 13:
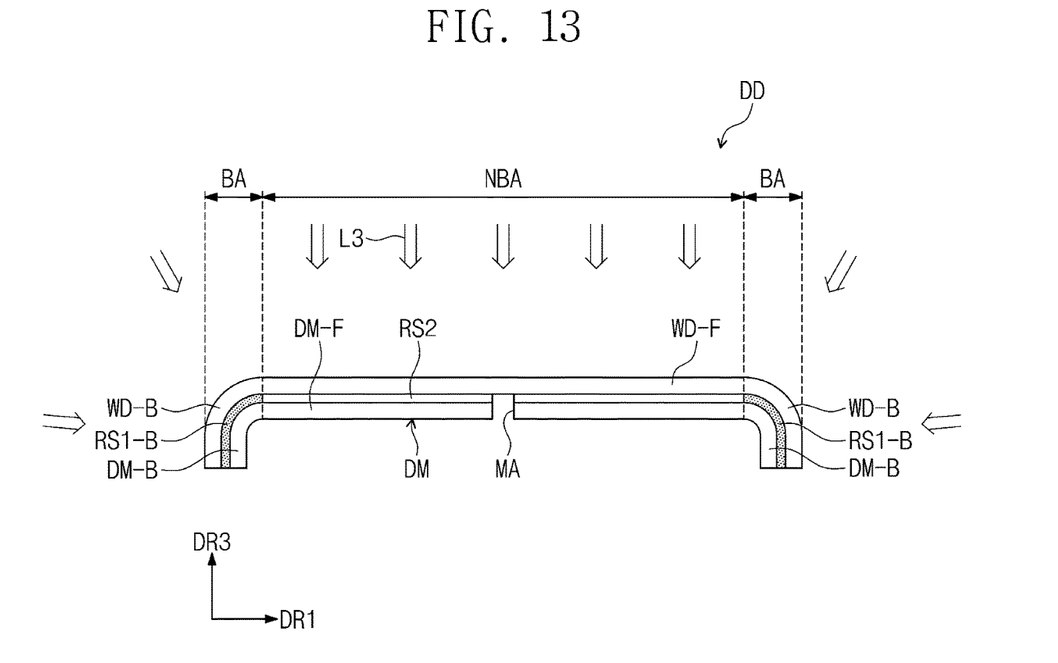

Referring to FIGS. 12 and 13, the method for manufacturing the display device DD according to an example embodiment of the present inventive concept may include aligning the window WD with the display module DM and combining the display module DM and the window WD to each other.

Referring to FIG. 12, the aligning of the window WD with the display module DM may include performing alignment so that a bending area WD-BA of the window WD corresponds to a first area DP-BA of the display module DM and performing alignment so that a non-bending area WD-NBA of the window WD corresponds to a second area DP-NBA of the display module DM.

Accordingly, the combining of the window WD to the display module DM may be performed so that a first window portion WD-B corresponds to the first portion DM-B and so that a second window portion WD-F corresponds to the second portion DM-F.

In the method for manufacturing a bended display device, when combining the window and the display module, it is desirable for the display module to be more adhered to the bent portion of the window than to the flat portion of the window. If the adhesion between the window and the display module is not strong, the adhered portions between the window and the display module may be separated by a force applied to the bent portion, or the adhesion therebetween may be weak. Thus, durability of the manufactured display device may be decreased. Here, in the method for manufacturing the bended display device, waviness may occur in the resin when the resin is applied on the display module. For example, in a case in which a hole is provided in the display module, the waviness may occur along a boundary of a hole area in which the hole may be formed. For example, a protruding portion may be formed on the resin along the boundary of the hole area. Here, in a case in which the resin has a high cure rate of about 50% or higher, flattening of the waviness may not be properly performed when the display module and the window are combined. Thus, an adhesive strength between the display module and the window may decrease, or the adhesive layer may be formed non-uniformly. Consequently, a stain may be viewed, and the visibility may be degraded.

According to the method for manufacturing the display device DD in the present embodiment, strong adhesive is obtained because the cure rate of the first preliminary adhesive layer RS11 is relatively high. Thus, the first portion DM-B of the display module DM may be firmly adhered to the first window portion WD-B. Therefore, the adhered portions between the first portion DM-B and the first window portion WD-B may be prevented from being separated, or the adhesion therebetween may be prevented from being weak. Also, since the cure rate of the second preliminary adhesive layer RS12 is relatively low in the present embodiment, waviness present in the second preliminary adhesive layer RS12 may be flattened when the display module DM and the window WD are combined. Even though the second preliminary adhesive layer RS12 has low adhesive strength due to a low cure rate, the adhered portions between the second portion DM-F and the second window portion WD-F are not separated from each other because of flat shapes thereof. Accordingly, the display device DD, which is manufactured by the method for manufacturing the display device DD according to an example embodiment of the present inventive concept, may have the high durability and high visibility.

Figure 14:
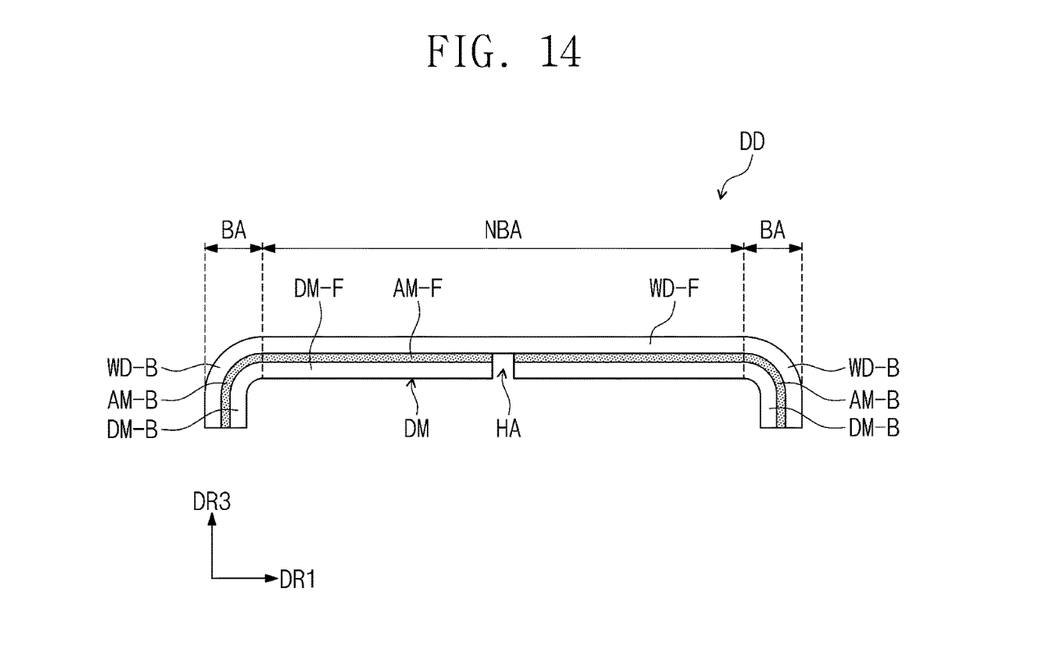

Referring to FIGS. 13 and 14, the method for manufacturing the display device DD according to an example embodiment of the present inventive concept may further include a main curing operation.

In the main curing operation, the first preliminary adhesive layer RS11 and the second preliminary adhesive layer RS21, or the first preliminary adhesive layer RS11 and the second resin RS2 are cured by a third light L3 to have a cure rate of about 90% to about 100%. Through the main curing operation, the adhesive layer AM may be formed.

The display device according to an example embodiment of the present inventive concept includes the adhesive layer that includes the first adhesive portion, having the first photoinitiator, and the second adhesive portion, having the second photoinitiator. Thus, according to an example embodiment of the present inventive concept, a display device having a high durability and high visibility may be provided. The method for manufacturing the display device according to an example embodiment of the present inventive concept includes applying the first resin and the second resin on the display module and forming the first preliminary adhesive layer by curing the first resin to have the cure rate of about 50% to about 80%. Thus, using the method for manufacturing the display device according to an example embodiment of the present inventive concept, the display device having the high durability and high visibility may be provided.

The display device according to an example embodiment of the present inventive concept may have high durability and high visibility.

Through the method for manufacturing the display device according to an example embodiment of the present inventive concept, the display device having the high durability and high visibility may be provided.

While the present inventive concept has been described with reference to example embodiments thereof, it will be understood by those of ordinary skill in the art that various changes in form and details may be made thereto without departing from the spirit and scope of the present inventive concept.

What is claimed is:

1. A display device comprising:
    a window including a bending area and a non-bending area;
    an adhesive layer comprising a first adhesive portion and a second adhesive portion, wherein the first adhesive portion overlaps the bending area, and the second adhesive portion overlaps the non-bending area; and
    a display module disposed on the adhesive layer,
    wherein the adhesive layer is disposed between the window and the display module,
    wherein the first adhesive portion is formed by curing a first resin comprising a first photoinitiator configured to have an initiation reaction induced by a first light,
    wherein the second adhesive portion is formed by curing a second resin comprising a second photoinitiator configured to have an initiation reaction induced by a second light or a thermal initiator, wherein the second light has a different central wavelength from that of the first light, and
    wherein the adhesive layer further comprises a third adhesive portion disposed between the first adhesive portion and the second adhesive portion, wherein the third adhesive portion is formed from a third resin.

2. The display device of claim 1, wherein a difference in central wavelengths between the first light and the second light is about 50 nm or more.

3. The display device of claim 1, wherein a central wavelength of the first light has a range of about 200 nm to about 300 nm or a range of about 300 nm to about 400 nm, and the central wavelength of the second light has the other range of the range of about 200 nm to about 300 nm and the range of about 300 nm to about 400 nm.

4. The display device of claim 1, wherein the first photoinitiator comprises at least one of compounds included in a first group or at least one of compounds included in a second group, and the second photoinitiator comprises at least one of compounds included in the other group of the first group and the second group, wherein the first group includes 2,2-Dimethoxy-2-phenylacetophenone, (η6-cumene)(η5-cyclopentadienyl)iron hexafluorophosphate, 2-Hydroxy-2-methylpropiophenone, [4-(2-hydroxytetradecyloxy)phenyl]phenyliodonium Hexafluoroantimonate, and 2-Isopropylthioxanthone, and the second group includes 2-Methyl-4'-(methylthio)-2-morpholinopropiophenone, 2-Benzyl-2-(dimethylamino)-4'-morpholinobutyrophenone, and Diphenyl (2,4,6-trimethylbenzoyl)-phosphine oxide.

5. The display device of claim 1, wherein a hole passes through the display module and the adhesive layer and overlaps the non-bending area.

6. The display device of claim 1, wherein the third adhesive portion overlaps the non-bending area,
    wherein the third adhesive portion is formed by curing the third resin comprising the first photoinitiator and the second photoinitiator.

7. The display device of claim 6, wherein the first photoinitiator and the second photoinitiator have concentration gradients in the third resin.

8. The display device of claim 6, wherein the first adhesive portion does not comprise the second photoinitiator, and the second adhesive portion does not comprise the first photoinitiator.

9. The display device of claim 1, wherein the display module comprises:
    a base substrate;
    a light emitting element layer disposed on the base substrate; and
    a thin film encapsulation layer disposed on the light emitting element layer and sealing the light emitting element layer.

10. The display device of claim 1, wherein the bending area comprises a first bending area and a second bending area, and the non-bending area is provided between the first bending area and the second bending area.

11. A display device comprising:

a window comprising a first window portion and a second window portion, wherein the first window portion has a bent shape, and the second window portion has a flat shape;

a display module comprising a first portion and a second portion, wherein the first portion overlaps the first window portion, and the second portion overlaps the second window portion, wherein a hole passes through the second portion; and an adhesive layer comprising a first adhesive portion and a second adhesive portion, wherein the first adhesive portion is disposed between the first window portion and the first portion, and the second adhesive portion is disposed between the second window portion and the second portion, wherein the adhesive layer is disposed between the window and the display module, wherein the first adhesive portion is formed by curing a first resin comprising a first photoinitiator configured to have an initiation reaction induced by a first light, wherein the second adhesive portion is formed by curing a second resin comprising a second photoinitiator configured to have an initiation reaction induced by a second light having a different central wavelength from the first light, wherein the adhesive layer further comprises a third adhesive portion disposed between the first adhesive portion and the second adhesive portion, wherein the third adhesive portion is formed from a third resin.

12. The display device of claim 11, wherein reactivity of the second photoinitiator with respect to the first light is lower than reactivity of the first photoinitiator with respect to the first light.

* * * * *